United States Patent
Chen

(10) Patent No.: US 9,196,540 B2
(45) Date of Patent: Nov. 24, 2015

(54) FINFET STRUCTURE WITH NOVEL EDGE FINS

(75) Inventor: Chung-Hui Chen, Hsinchu (TW)

(73) Assignee: TAIWAN SEMICONDUCTOR MANUFACTURING COMPANY, LTD. (TW)

(*) Notice: Subject to any disclaimer, the term of this patent is extended or adjusted under 35 U.S.C. 154(b) by 0 days.

(21) Appl. No.: 13/368,027

(22) Filed: Feb. 7, 2012

(65) Prior Publication Data

US 2013/0200449 A1  Aug. 8, 2013

(51) Int. Cl.

| H01L 27/108 | (2006.01) |
|---|---|
| H01L 21/8234 | (2006.01) |
| H01L 21/84 | (2006.01) |
| H01L 29/66 | (2006.01) |
| H01L 27/088 | (2006.01) |
| H01L 27/12 | (2006.01) |

(52) U.S. Cl.
CPC ...... *H01L 21/823431* (2013.01); *H01L 21/845* (2013.01); *H01L 27/0886* (2013.01); *H01L 27/1211* (2013.01); *H01L 29/6681* (2013.01)

(58) Field of Classification Search
CPC .............. H01L 21/823418–21/823431; H01L 21/823814–21/823821; H01L 21/845; H01L 27/0886–27/0924; H01L 27/10826; H01L 27/10879; H01L 27/1211; H01L 29/41791; H01L 29/66772; H01L 29/66795; H01L 29/7831; H01L 29/785; H01L 2924/13067; H01L 21/8234
USPC .......... 257/296, 401, 571, 586, 618, E21.677, 257/E29.131, E29.267
See application file for complete search history.

(56) References Cited

U.S. PATENT DOCUMENTS

| 8,035,170 | B2 | 10/2011 | Inaba | |
|---|---|---|---|---|
| 2007/0045736 | A1* | 3/2007 | Yagishita | 257/347 |
| 2008/0179635 | A1* | 7/2008 | Gossner | 257/241 |
| 2008/0251849 | A1* | 10/2008 | Yamagami et al. | 257/368 |
| 2009/0134472 | A1* | 5/2009 | Inaba | 257/390 |
| 2010/0001331 | A1* | 1/2010 | Mikasa | 257/306 |
| 2010/0025767 | A1 | 2/2010 | Inaba | |

FOREIGN PATENT DOCUMENTS

| JP | 2009-130210 | 6/2009 |
|---|---|---|
| JP | 2010-40630 | 2/2010 |

OTHER PUBLICATIONS

Office Action dated Nov. 19, 2013 with English Translation from corresponding application No. KR 10-2012-0139472.
Notice of Allowance dated Jun. 9, 2014 and English translation from corresponding No. KR 10-2012-0139472.

* cited by examiner

Primary Examiner — David Vu
Assistant Examiner — Cuong Nguyen
(74) Attorney, Agent, or Firm — Hauptman Ham, LLP

(57) ABSTRACT

A semiconductor device including field-effect transistors (finFETs) formed on a silicon substrate. The device includes a number of active areas each having a number of equally-spaced fins separated into regular fins and at least one edge fin, a gate structure over the regular fins, and a drain region as well as a source region electrically connected to the regular fins and disconnected to the at least one edge fin. The edge fins may be floating, connected to a potential source, or serve as a part of a decoupling capacitor.

20 Claims, 8 Drawing Sheets

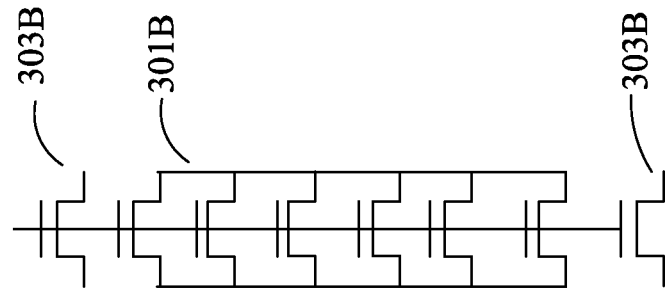
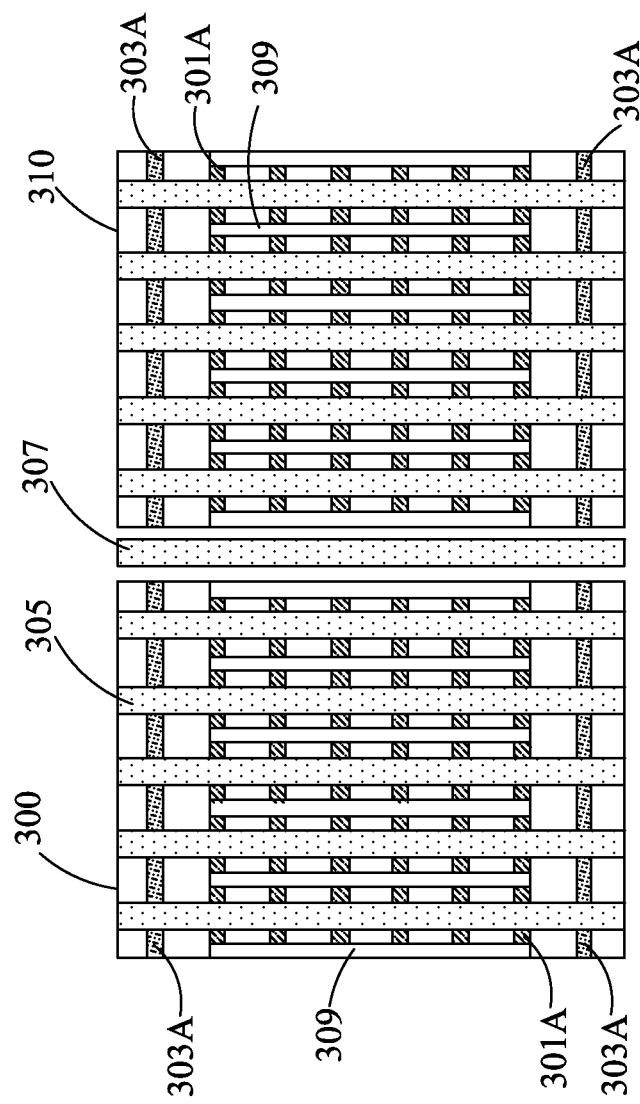
Figure. 3B
Figure. 3A

FINFET STRUCTURE WITH NOVEL EDGE FINS

FIELD

This disclosure relates generally to semiconductor transistor design, and more specifically to fin field-effect transistors (FinFETs).

BACKGROUND

Transistors are formed in both digital and analog areas of an integrated circuit (IC). Transistors are typically formed by providing an active area with doped source/drain regions in the substrate, a gate insulating layer over the substrate, and a gate electrode over the gate insulating layer. Contacts connect the source/drain regions and gate electrodes with a conductive interconnect structure having several horizontal conductive pattern layers and vertical via layers formed within a plurality of inter-metal dielectric (IMD) layers.

As IC dimensions shrink, transistor design shift to a three-dimensional design with multiple gates, specifically fin field-effect transistors (FinFETs). FinFET devices typically include a number of semiconductor fins having high aspect ratios in which the channel and source/drain regions for the transistor are formed. A gate is formed over and along the sides of a portion of the semiconductor fins.

Because FinFETs are three-dimensional, the effective widths are larger than a corresponding planar transistor. In addition to the width of the active area, the effective FinFET width also includes two times the protruded portion of the fins, namely the height of the fins. In other words, the protruded portion of the fins adds to the effective width of the FinFET. The use of fins increases surface areas of the channel and source/drain regions for the same surface area. The increased surface area of the in a FinFET results in faster, more reliable and better-controlled semiconductor transistor devices that consume less power.

While FinFET devices provide improved characteristics, design improvements that reduce effect of mass-production processes continue to be sought.

BRIEF DESCRIPTION OF THE DRAWINGS

FIGS. 3A and 3B are top views of FinFETs and a circuit representation of the FinFETs in accordance with various embodiments of the present disclosure.

DETAILED DESCRIPTION

Figure 1:
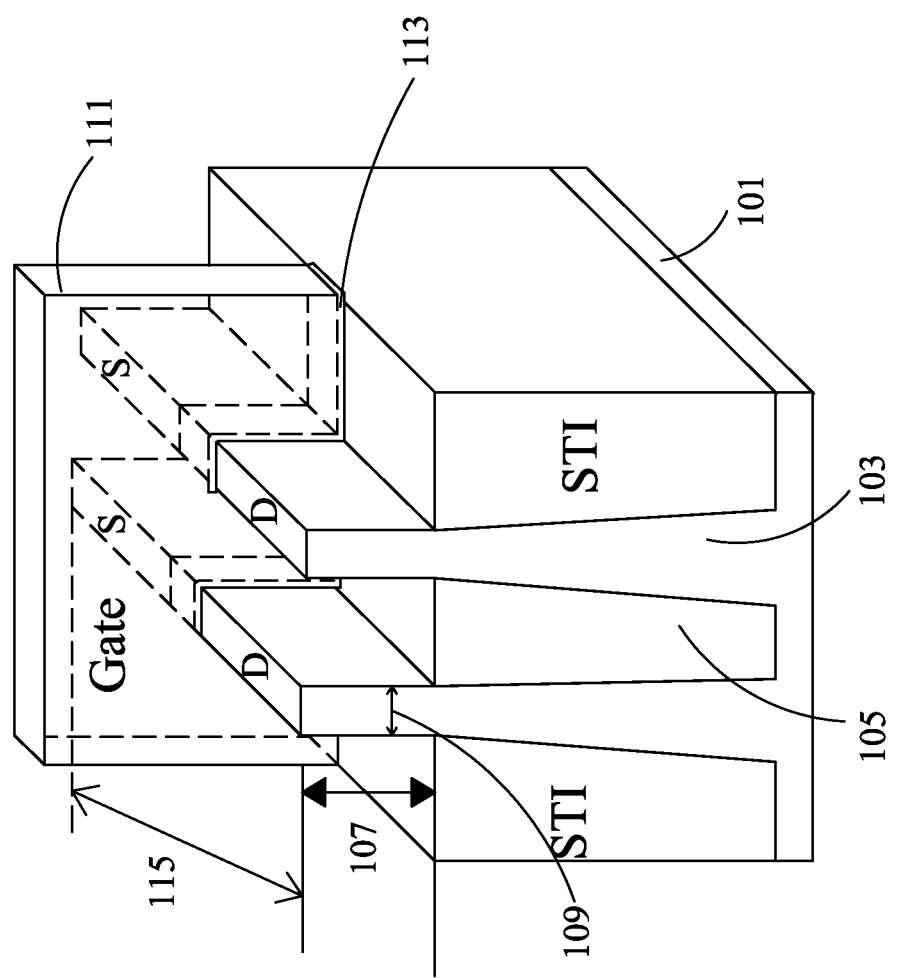
FIG. 1 is a perspective view of a fin field-effect transistor (FinFET) according to one or more embodiments of the present disclosure.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Like items in different figures are indicated by like reference numerals.

As integrated circuit (IC) dimensions decrease, planar transistors increasingly suffer from the undesirable short-channel effect, especially "off-state" leakage current, which increases the idle power required by the device. In a fin field-effect-transistor (FinFET), the channel is surrounded by several gates on multiple surfaces, allowing more effective suppression of "off-state" leakage current. FinFETs have higher drive currents and are more compact than conventional planar transistors.

FinFETs use a substantially rectangular fin structure. In one method, shallow trench isolation (STI) features 105 are formed first on bulk silicon material, shown in FIG. 1 as substrate 101. Bottoms of trenches between the STI features 105 are exposed bulk silicon. Silicon is then grown in the trenches to form fins 103 by using, for example, an epitaxial process. Once a desired fin height is reached, then the STI features 105 are etched to a level below a top of the fin 103 to expose a portion of the fin 103. The exposed portion of the fin 103 is a top portion 107 and the embedded portion is a bottom portion. The fins 103 have a width 109. The bulk silicon material 101 is a silicon substrate or a deposited silicon such as silicon-on-insulator (SOI) with a barrier oxide (BOX) layer between the SOI and the underlying silicon substrate. Using this method, the STI features 105 define the size and shape of the fins 103. Depending on etch parameters used when the trenches are formed, the fins 103 may have a variety of substantially rectangular shapes, including the slight angle at the bottom portion of the fin, as shown in FIG. 1.

In another method, bulk silicon on a substrate is etched into a rectangular fin shape by first patterning and depositing a hardmask layer on the bulk silicon. The hardmask forms a pattern covering the top of the fins. The bulk silicon is then etched to form trenches between the regions covered by the hardmask layer. The trenches are formed into shallow trench isolation (STI) features 105 by depositing a dielectric material, usually silicon oxide, into the trenches. The dielectric material is usually deposited to completely cover the fins 103 and, optionally, the hardmask layer, if not yet removed. The dielectric material is planarized down to the top surface of the fin or the hardmask, and then the dielectric material is etched to a level below the top of the fin so that a portion of the fin protrudes above the STI features 105. The protruded fin portion has a fin height 107 and a width 109.

In a variation of the second method, the hardmask in etching the bulk silicon is formed by a process using mandrels. A photoresist pattern is formed and used to etch a mandrel pattern. A conformal spacer material is then deposited around the mandrel. The conformal spacer is usually formed of a hardmask material forming a spacer sidewall thinner than that of the mandrel. The mandrel material between the spacers is then removed in subsequent etching operations to leave just the spacers behind. Some of the spacers are then used as a hardmask for etching the underlying silicon layers to form the fin structures 103. Using the mandrel/spacer method, thinner fins that are closer together can be formed than the first method or the unmodified second method. The exposed fin portions have a height dimension (h, 107), a width dimension (w, 109) and a length dimension (l, 115). Some electrical properties of the FinFET can be defined relative to these dimensions. For example, an effective channel width for the transistor may be calculated using the dimension of the fins under the gate. As shown in FIG. 1, the effective channel width is 2 fins, or 2×(2h+w). Note that the effective channel width does not include the distance between fins.

The remaining FinFET forming process steps are described here to provide context for the present disclosure. A gate structure is formed over the fins. A gate dielectric layer 113 and gate electrode layer 111 are deposited over the fins 103 and the STI features 105. Gate dielectric layer 113 is formed of a high dielectric constant (high-k) dielectric material. Exemplary high-k materials have k values greater than about 4.0, or even greater than about 7.0, and include aluminum-containing dielectrics such as $Al_2O_3$, HfAlO, HfAlON, or AlZrO; Hf-containing materials such as $HfO_2$, $HfSiO_x$, $HfAlO_x$, $HfZrSiO_x$, or HfSiON; and/or other materials such as $LaAlO_3$ or $ZrO_2$. Gate electrode layer 111 is formed on the gate dielectric layer 113, and may be formed of a conductive material such as doped polysilicon, metals, or metal nitrides.

The gate electrode layer 111 and gate dielectric layer 113 are patterned to form a gate structure over one or more middle portion of the fins 103. Only one gate structure is shown in FIG. 1, but a FinFET includes many gate structures, in some embodiments. The fin portions not under the gate structure are then optionally doped to form lightly doped drain and source (LDD) regions. The dopant used depends on the conductivity type of the transistor. The LDD regions may be doped by ion-implanting or by plasma doping where dopants are deposited onto the fin 103 and annealed. Source and drain regions are formed across the gate structure over and between the fins. Source and drain regions may be formed by ion-implanting a source/drain region or by removing a portion of the fin and epitaxially re-growing the removed portion under doping conditions to form a source/drain region.

Figure 2:
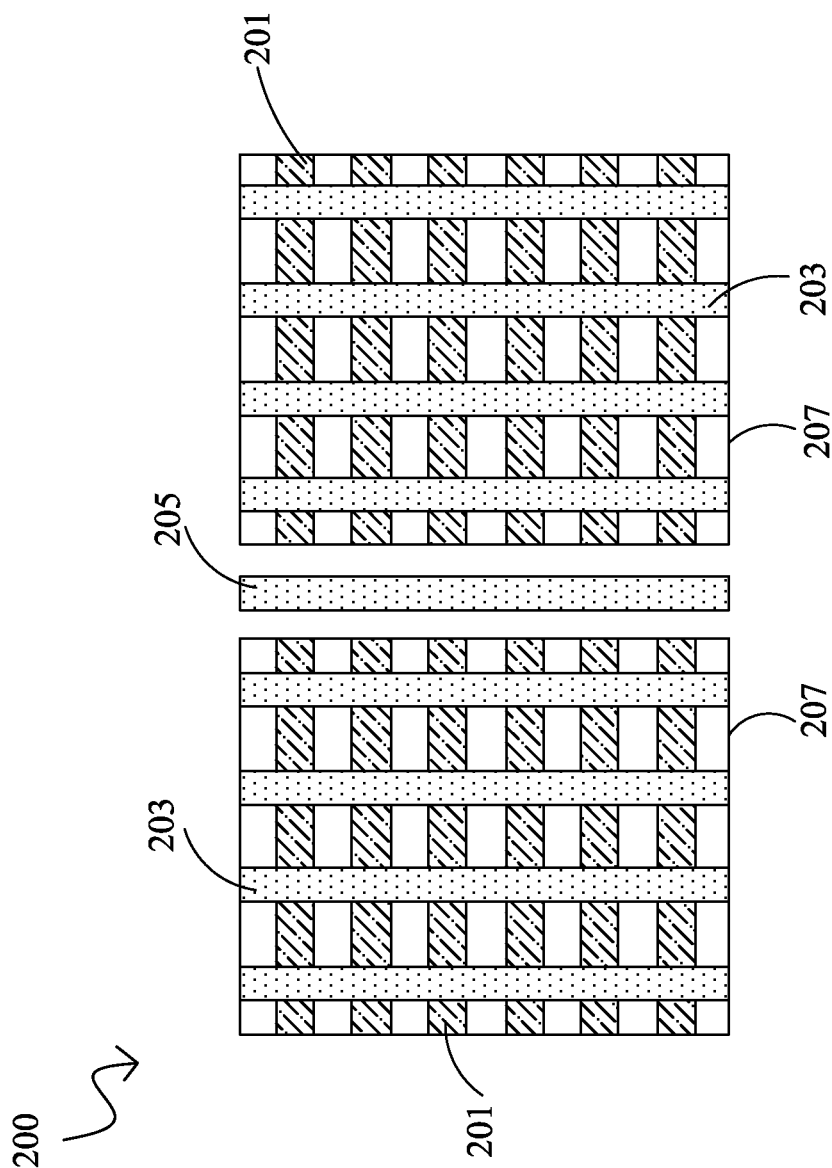
FIG. 2 is a top view of two field-effect transistors (FinFETs) according to one or more embodiments of the present disclosure.

A circuit designer specifies transistors in a design according to electrical properties for performing various functions. Electrical properties to be considered include turn on voltage (threshold voltage), breakdown voltage, on-state current, leakage current, among others. The on-state current is the current that may be driven through the transistor when the gate voltage is equal to the threshold voltage. A FinFET may be modeled as a combination of metal-oxide-semiconductor field-effect transistors (MOSFETs) sharing a gate, source, and drain with one fin each. The threshold voltage and on-state current of each MOSFET becomes increasingly sensitive to channel width as the fin width becomes increasingly small. When a circuit is designed using planar transistors, the channel width may be any value by just making the transistor wider or narrower. However, with FinFETs, the channel width is an integer multiple of the dimensions for a single fin. For example, a FinFET channel width may be equal to 2 fins or 3 fins but not 2.5 fins. While a range of on-state currents may be acceptable, depending on the circuit functionality and application, the threshold voltage matches input of other devices. Thus, the channel widths are controlled to limit variation of threshold voltage, especially in analog regions of an integrated chip device where a mismatch may cause a circuit to perform incorrectly. FIG. 2 illustrates a top view of a FinFET layout 200 with two FinFETs. Each FinFET includes 6 fins 201 and 4 gate structures 203, with a dummy gate 205 between the two FinFETs. A perimeter of each FinFET around the fins 201 and gate structures 203 is an active area 207. The active area 207 includes at least one fin 201 and may include twenty or more fins, depending on the circuit requirements for the FinFET.

As discussed, in some embodiments, fins are formed by plasma etching into a silicon substrate using different materials as an etch mask. The etch mask may be a deposited hardmask, or spacers around a removed mandrel. The plasma etching process is prone to localized loading effects such as where the amount etched is dependent on density of features etched and aspect ratios of features. As result, fins around an edge of an active area are etched to a different degree from fins in the center of an active area. The localized loading effects are more pronounced when the fins are closer together, such as with decreasing IC feature size. In one instance, a fin width at the edge of an active area can vary as much as 50% from a fin width at the center of an active area. Because fin widths are directly related to effective channel width, having varying fin widths across a FinFET increases the complexity and difficulty of modeling electrical behavior for a FinFET. Further, the varying fin widths may cause a FinFET threshold voltage and on-state current to be different from an equivalent planar transistor.

Various embodiments of the present disclosure pertain to FinFET structures within an active area that reduces the fin width variation at the edges of an active area. According to various embodiments, one of more of edge fins in an active area is not connected to the drain region or source region, or both regions of the FinFET. From the perspective of the FinFET, the one or more edge fins, up to about four fins, are dummy fins and can be removed from the electrical modeling of FinFET. Because the dummy fins width may vary depending on process conditions, the removal simplifies the electrical modeling. Further, localized loading effects would not affect the threshold voltage of the FinFET and improves analog matching. One measurement found a current variation by as much as 75% as compared to an equivalent planar transistor.

FIGS. 3A and 3B illustrate FinFET structures and a resulting circuit according to some embodiments of the present disclosure. FIG. 3A is a top view diagram of two FinFETs formed using a number of fins 301A and 303A within active areas 300 and 310, respectively. Active areas 300 and 310 each include total of 8 fins 301A and 303B separated into regular fins 301A and edge fins 303A. While two edge fins 303A are shown, the number of edge fins 303A may be one or may be more than two. In embodiments where more than two edge fins 303A are used, edge fins 303A are located on either side of the regular fins 301A. Gate structures 305 are formed across the fins 301A and 303B and metal lines 309 connect the regular fins 301A. A dummy gate structure 307 is formed between the two active areas 300 and 310. The edge fins 303A are not connected to an interconnect structure.

The FinFETs of FIG. 3A can be made without adding any process steps to the FinFET manufacturing process. However, the photomask used to form a source region, a drain region, and the metal lines 309 is modified to cover only the regular fins 301A and not the edge fins 303A. The resulting FinFET has little or no fin width variation, for example, less than about 3% or less than about 1%. In some embodiments, the fin width variation is between about 0.25% and 1%. The reduced fin width variation simplifies the electrical model and reduces the likelihood of threshold voltage mismatch and on-state current variation between operable fins in the Fin-FET.

FIG. 3B shows an electrical diagram of one of the active areas of FIG. 3A. Each of the regular fins 301A in effect forms a portion of MOSFET 301B. Various MOSFETs 301B are connected together and are controlled as one transistor whose electrical property is a combination of the individual MOSFETs 301B. The edge fins 303B also form MOSFETs, but are not connected to any interconnect structure. Thus during transistor operation, the edge MOSFETs 303B are floating electrically, which may affect the FinFET as noise.

Figure 4B:
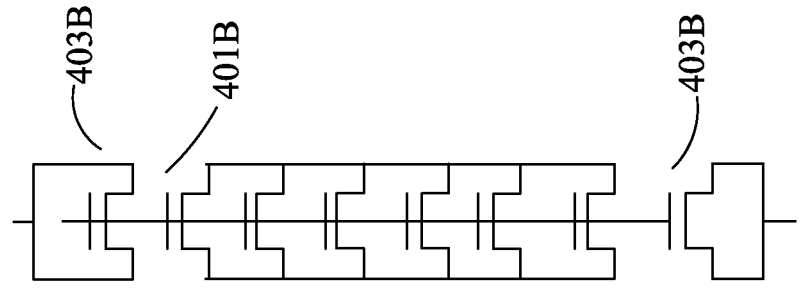
FIGS. 4A and 4B are top view of FinFETs and a circuit representation of the FinFETs in accordance with some embodiments of the present disclosure.
Figure 4A:
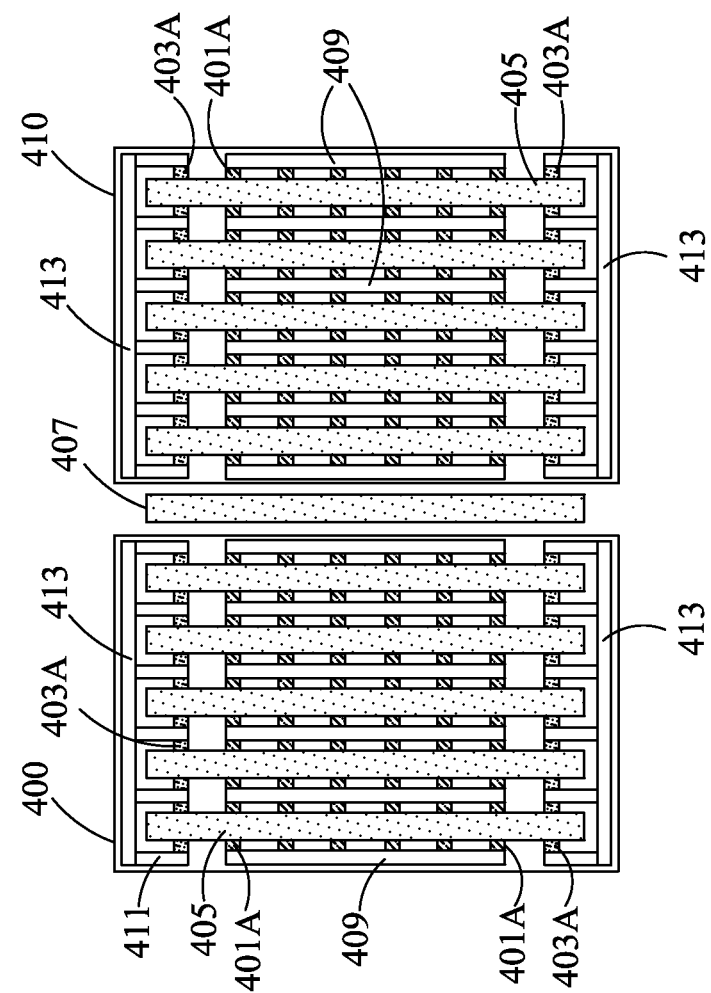

FIGS. 4A and 4B illustrates FinFET structures and a resulting circuit according other embodiments of the present disclosure. FIG. 4A is a top view diagram of two FinFETs formed using a number of fins 401A and 403A within active areas 400 and 410, respectively. Active areas 400 and 410 each include 8 total fins 401A and 403B separated into regular fins 401A and edge fins 403A. While two edge fins 403A are shown, the number of edge fins 403A may be one or may be more than two. In embodiments where more than two edge fins 403A are used, edge fins 403A are located on either side of the regular fins 401A. Gate structures 405 are formed across the fins 401A and 403B and metal lines 409 connect the regular fins 401A. A dummy gate structure 407 is formed between the two active areas 400 and 410. The edge fins 403A are connected to an interconnect 411 and bus 413. The bus 413 is connected to a constant potential source, either to a voltage source (not shown) or a ground.

The FinFETs of FIG. 4A can be made little or no additional process steps to the FinFET manufacturing process. The photomask used to form a source region, a drain region, and is modified to cover only the regular fins 401A and not the edge fins 403A. The photomask used to form the metal lines 409 is modified to form interconnect 411 and possibly bus 413. However, a connection between the bus 413 and a constant potential source may require additional manufacturing steps.

FIG. 4B shows an electrical diagram of one of the active areas of FIG. 4A. Each of the regular fins 401A in effect forms a portion MOSFET 401B. Various MOSFETs 401B are connected together and are controlled as one transistor whose electrical property is a combination of the individual MOSFETs 401B. The edge fins 403A are connected to an interconnect structure 411 and the bus 413 that are connected to a constant potential, either a voltage source or a ground. Thus during transistor operation, the edge fins 403A are held electrically at a constant voltage. In these embodiments, edge MOSFETs 403B do not affect the FinFET as noise. In some embodiments, edge MOSFETs 403B may reduce FinFET noise. When a potential difference exists across the FinFET gate and the edge fins 403A, some electrical energy is stored in an electrical field across a gate dielectric between the edge fins 403A and the FinFET gate. The edge MOSFETs 403B effectively act as a decoupling capacitor and consume power in a manner similar to a capacitor.

Figure 5B:
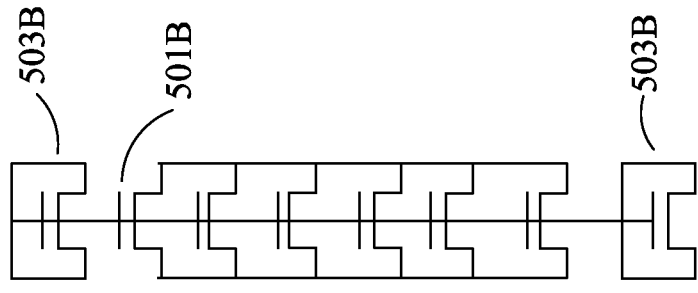
FIGS. 5A and 5B are top view of FinFETs and a circuit representation of the FinFETs in accordance with some embodiments of the present disclosure.
Figure 5A:
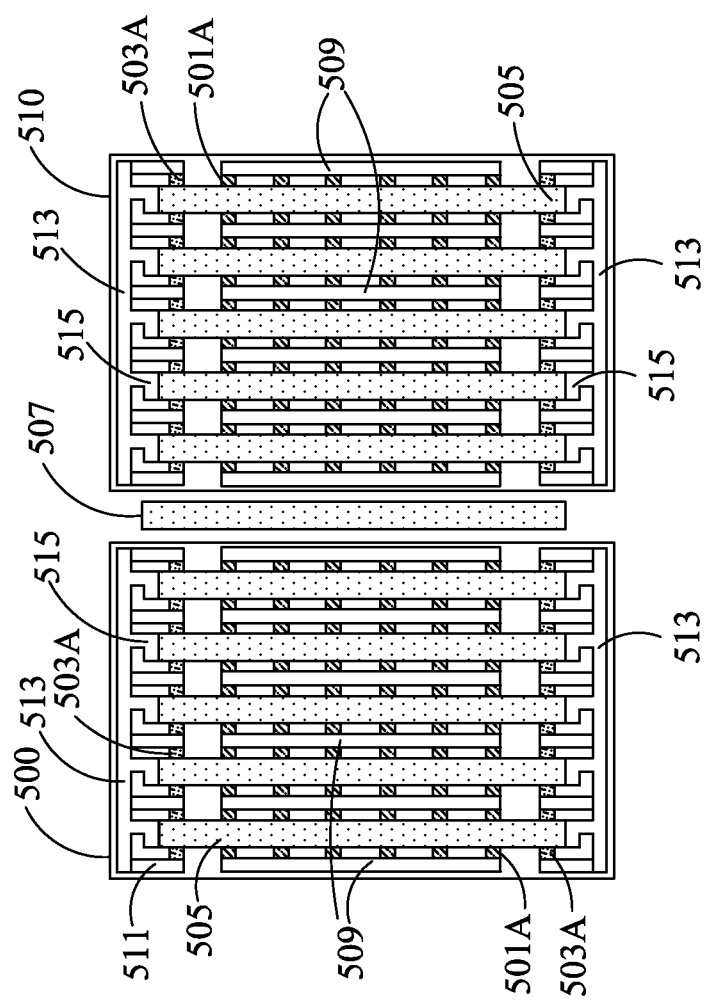

According yet other embodiments of the present disclosure, FIGS. 5A and 5B illustrate FinFET structures and a resulting circuit. FIG. 5A is a top view diagram of two FinFETs formed using a number of fins 501A and 503A within active areas 500 and 510, respectively. Active areas 500 and 510 each include 8 total fins 501A and 503B separated into regular fins 501A and edge fins 503A. While two edge fins 503A are shown, the number of edge fins 503A may be one or may be more than two. In embodiments where more than two edge fins 503A are used, edge fins 503A are located on either side of the regular fins 501A. Gate structures 505 are formed across the fins 501A and 503B and metal lines 509 connect the regular fins 501A. A dummy gate structure 507 is formed between the two active areas 500 and 510. The edge fins 503A are connected to an interconnect 511 and a bus 513. The bus 513 is connected to the gate structures 505 through another interconnect 515.

The FinFETs of FIG. 5A can be made little or no additional process steps to the FinFET manufacturing process. The photomask used to form a source region, a drain region, and is modified to cover only the regular fins 501A and not the edge fins 503A. The photomask used to form the metal lines 509 is modified to form interconnects 511/515 and possibly bus 513.

FIG. 5B shows an electrical diagram of one of the active areas of FIG. 5A. Each of the regular fins 501A in effect forms a portion MOSFET 501B. Various MOSFETs 501B are connected together and are controlled as one transistor whose electrical property is a combination of the individual MOSFETs 501B. The edge fins 503A are connected to the interconnect structures 511 and 515 and the bus 513 that are connected to the gate structure 505. Thus during transistor operation, the edge fins 503A are held electrically at the same potential as the gate of the FinFET. In these embodiments, the edge MOSFETs 503B do not affect the FinFET as noise and consume no power because no current flows across the edge MOSFETs 503B while the gate is effectively shorted to the source and drain region of the edge MOSFETs 503B.

A variation of the embodiments of FIGS. 5A and 5B involves forming a portion of the gate structure 505 over the edge fins 503A such that no gate dielectric is formed over the edge fins 503A. When the gate stack includes no dielectric, the gate is conductively contacting the edge fins 503A directly. In these embodiments, the edge fins 503A are directly shorted to the FinFET gate without the interconnects 511 and 515 or the bus 513. One way to effect this embodiment is to etch off at least a portion of the gate dielectric deposited over the edge fins 503A before depositing rest of the gate stack so that conductive elements of the gate stack directly contact the edge fins 503A.

Figure 6:
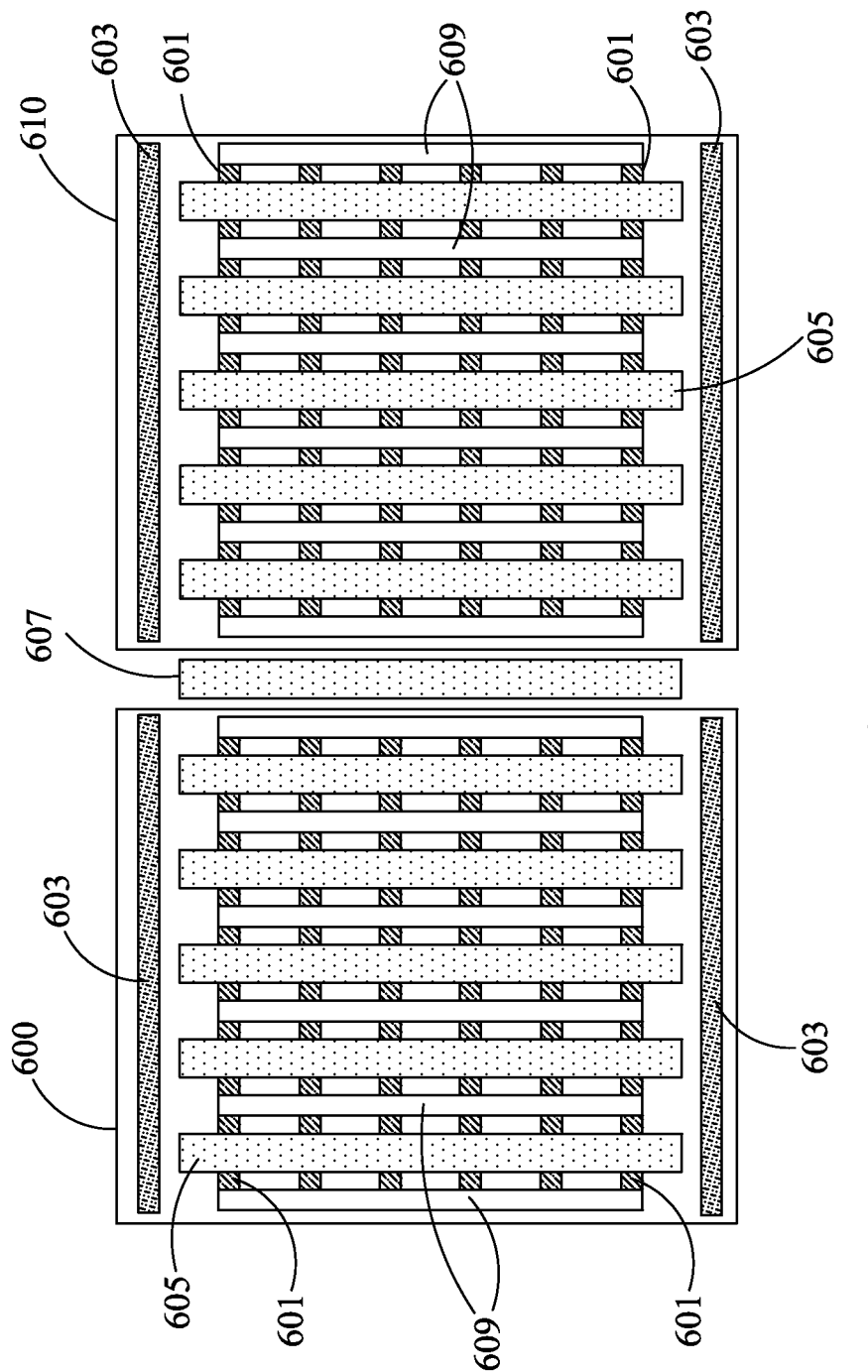
FIG. 6 is a top view of two FinFETs in accordance with some embodiments of the present disclosure.

FIG. 6 shows still other embodiments of FinFETs according to the present disclosure. FIG. 6 is a top view diagram of two FinFETs formed using a number of fins 601 and 603 within active areas 600 and 610, respectively. Active areas 600 and 610 each include 8 total fins 601 and 603 separated into regular fins 601 and edge fins 603. While two edge fins 603 are shown, the number of edge fins 603 may be one or may be more than two. In embodiments where more than two edge fins 603 are used, the edge fins 603 are located on either side of the regular fins 601. Gate structures 605 are formed across the regular fins 601 without contacting edge fins 603. Metal lines 609 connect the regular fins 601. A dummy gate structure 607 is formed between the two active areas 600 and 610.

In these embodiments, the edge fins 603 may be floating, be connected to a potential source or ground such as the embodiments of FIGS. 4A and 4B, or be connected to the gate structures 605 by an interconnect similar to the embodiments of FIGS. 5A and 5B. While the edge fins 603 are not connected to any part of the FinFETs, the edge fins 603 are still formed with the regular fins 601 within the active areas 600 and 610. If connected to a potential, ground, or the gate structures 605, the edge fins 603 can reduce cross talk between adjacent FinFETs without adding noise.

Figure 7:
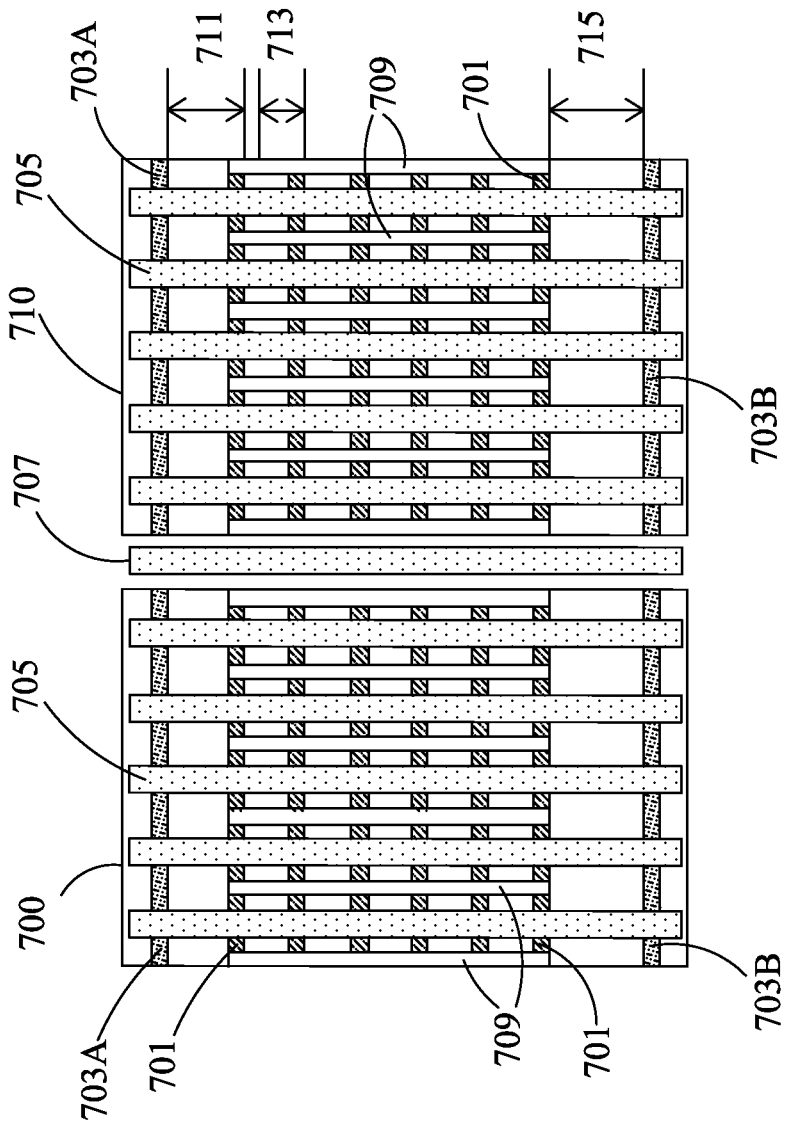
FIG. 7 is a top view of two FinFETs in accordance with some embodiments of the present disclosure.

FIG. 7 shows embodiments of FinFETs according to the present disclosure where the regular fins and edge fins are not equally spaced. FIG. 7 is a top view diagram of two FinFETs formed using a number of fins 701, 703A and 703B within active areas 700 and 710, respectively. Active areas 700 and 710 each include 8 total fins 701, 703A and 703B separated into regular fins 701 and edge fins 703A and 703B. While two edge fins 703A and 703B are shown, the number of edge fins 703A and 703B may be one or may be more than two. In embodiments where more than two edge fins 703A and 703B are used, the edge fins 703A and 703B are located on either side of the regular fins 703A and 703B. Gate structures 705 are formed across the regular fins 701 without contacting edge fins 703A and 703B. Metal lines 709 connect the regular fins 701. A dummy gate structure 707 is formed between the two active areas 700 and 710.

A top edge fin distance 711 marks the space between edge fin 703A and an adjacent regular fin 701. A bottom edge fin distance 715 marks the space between edge fin 703B and adjacent regular fin 701. A regular fin distance 713 marks the space between adjacent regular fins 701. According to these embodiments, a ratio of both of the edge fin distances 711 and 715 to regular fin distance 713 is between about 1 to about 5. Edge fin distances 711 and 715 may be same or different. In certain embodiments, there may be intervening fins formed with the fins 701, 703A and 703B and subsequently removed before the gate structure is formed.

Figure 8:
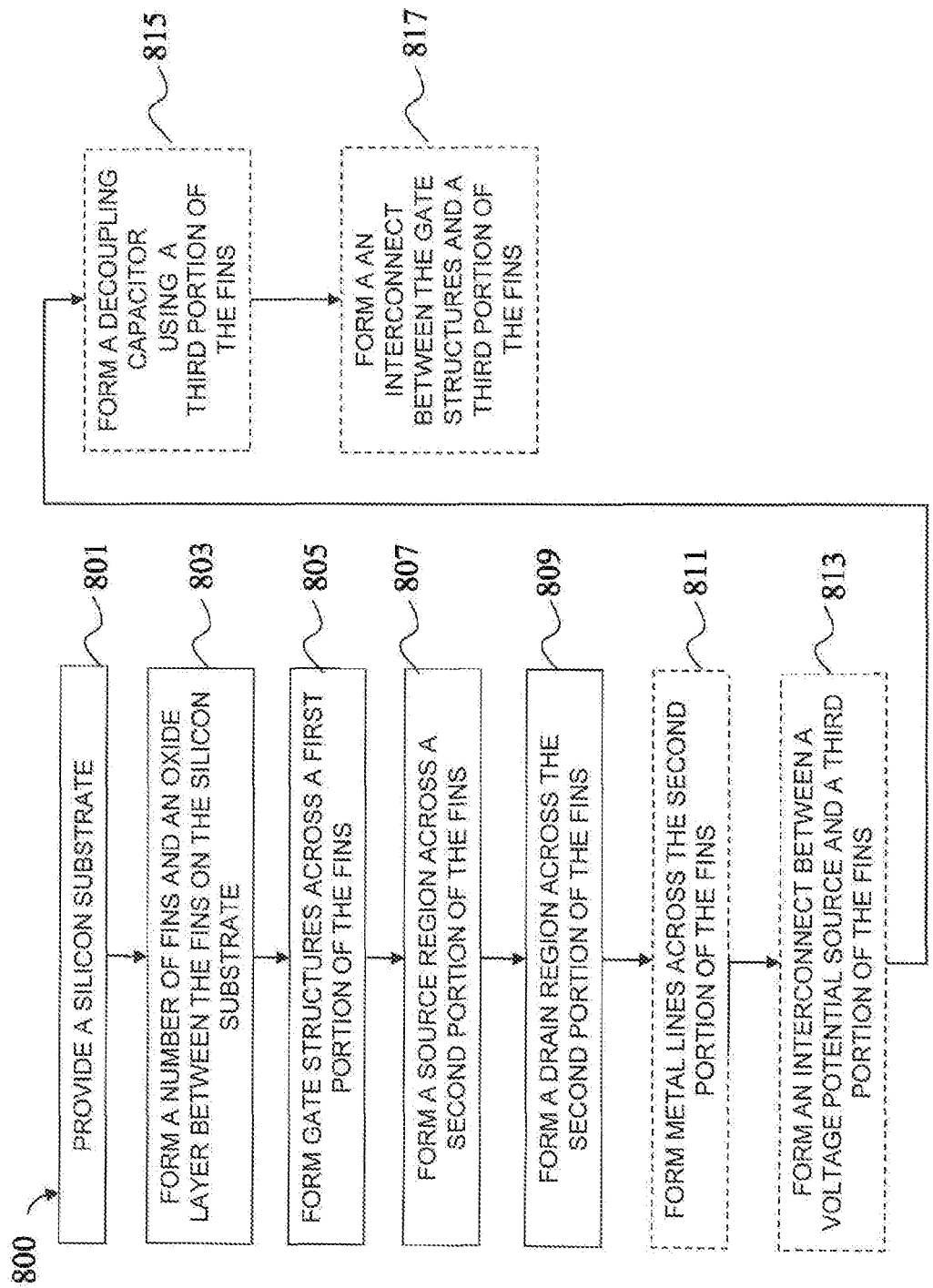
FIG. 8 is a flow chart of another method for forming fin capacitors in accordance with various embodiments of the present disclosure.

One aspect of the present disclosure pertains to a method for forming FinFETs. FIG. 8 is a simplified process flow diagram showing a method 800 for forming FinFETs in accordance with various embodiments of the present disclosure. In operation 801, a silicon substrate is provided. The silicon substrate may be a silicon wafer or another substrate with silicon material thereon, such as a silicon-on-insulator layer. Next a number of fins and an oxide layer between the fins are formed on the silicon substrate in operation 803. The process for forming the fins are described above in association with FIG. 1 and is not repeated here. Gate structures are then formed across a first portion of the fins in operation 805. This first portion of fins may be the regular fins within an active area or may be some or all of the edge fins. Forming a gate structure is also described above and is not repeated here.

In operation 807, a source region is formed across a second portion of the fins. The second portion of the fins includes only the regular fins from which the FinFET is formed. In operation 809, a drain region is formed across the second portion of the fins. Note that the source region and the drain region are formed on opposite sides of the gate structure. Source and drain formation for FinFETs are also described above and not repeated here. With these operations, a FinFET that is consistent with certain embodiments of the present disclosure is formed.

Optional operations 811, 813, 815, and 817 may be performed in combination or singly to form FinFET embodiments according to various other embodiments of the present disclosure. In operation 811, metal lines are formed across the second portion of the fins. These metal lines may be deposited in the same operation as the interconnects of operations 813 and 817. In operation 813, an interconnect between a voltage potential source and a third portion of the fins is formed. The interconnect may include one or more branches, such as a number of metal lines and a bus line. The voltage potential source is a constant voltage source, a varying voltage source, or a ground. The third portion of fins includes only edge fins, which may be between one and four fins, or more. Operation 813 may be used to form FinFET embodiments of FIGS. 4A and 4B.

In operation 815, a decoupling capacitor is formed using the third portion of the fins. The decoupling capacitor may be a metal oxide semiconductor capacitor. One conducting portion is the third portion of fins, made of silicon material. Another conducting portion is the conducting portion of the gate structure. The gate dielectric is the capacitor dielectric. In some embodiments, the operation 813 is performed to form the decoupling capacitor of operation 815.

In operation 817, an interconnect is formed between the gate structures and a third portion of the fins. The third portion of fins includes only edge fins, which may be between one and four fins, or more. The interconnect may include one or more branches, such as a number of metal lines and a bus line, and connect to conducting portions of the gate structure. Operation 817 may be used to form FinFET embodiments of FIGS. 5A and 5B.

According to various embodiments, the present disclosure pertains to FinFET structures that minimizes fin width variation and associated issues as to threshold voltage and on-state current. The FinFET structures include a semiconductor substrate including a plurality of active areas. Each of the plurality of active area includes a number of equally-spaced fins, having one or more regular fins and at least one edge fin. Each of the active areas also includes a gate structure over the one or more regular fins; and, a drain region and a source region. The drain region and the source region are electrically connected to the one or more regular fins and disconnected to the at least one edge fin. The one or more regular fins, the gate structure, the drain region, and the source region form a fin field-effect transistor (FinFET).

According to certain embodiments, the present disclosure pertains to a FinFET based semiconductor device. The device includes a digital region and an analog region. The analog region includes a number of active areas each having a plurality of fins, a plurality of gate structures, and a drain region and a source region. The plurality of fins includes two or more regular fins and at least one edge fin. The gate structures are disposed at least over the two or more regular fins. The drain region and the source region are electrically connected to the two or more regular fins and disconnected from the at least one edge fin. A distance between the at least one edge fin and an adjacent regular fin is between one and five times greater than a distance between two adjacent regular fins.

In some embodiments, the digital region a plurality of digital active areas, each including a plurality of equally-spaced fins consisting of regular fins, a plurality of gate structures over the plurality of equally-spaced fins; and, a drain region and a source region, the drain region and the source region being electrically connected to the plurality of equally-spaced fins. The digital active areas do not include edge fins.

According to some embodiments, the present disclosure pertains to a method for forming FinFETs. The method includes providing a silicon substrate, forming a plurality of fins and an oxide layer between the plurality of fins on the silicon substrate, forming a plurality of gate structures across a first portion of the plurality of fins, forming a source region across a second portion of the plurality of fins, forming a drain region across the second portion of the plurality of fins, and forming a plurality of metal lines across the second portion of the plurality of fins. The second portion of fins is smaller than the plurality of fins and the first portion of fins covers at least the second portion of fins.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. It is understood, however, that these advantages are not meant to be limiting, and that other embodiments may offer other advantages. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor substrate comprising a plurality of active areas, the active areas of the plurality of active areas comprising:
   a plurality of equally-spaced fins, including a plurality of sequential regular fins between at least two edge fins;
   a gate structure over the plurality of regular fins; and
   a drain region and a source region, the drain region and the source region being electrically connected to the plurality of regular fins and disconnected from the at least two edge fins;
   a first bus configured to be coupled to a voltage potential source;
   a first interconnect structure coupled to a first edge fin of the at least two edge fins and to the first bus;
   a second bus electrically connected to a ground; and
   a second interconnect structure electrically connected to the second bus and to a second edge fin of the at least two edge fins,
   wherein the plurality of regular fins, the gate structure, the drain region, and the source region form a fin field-effect transistor (FinFET), the first edge fin of the at least two edge fins is connected to the voltage potential source by way of the first interconnect structure and the first bus, and the second edge fin of the at least two edge fins is connected to the ground by way of the second interconnect structure and the second bus.

2. The semiconductor device of claim 1, wherein the gate structure is further disposed over the first edge fin of the at least two edge fins.

3. The semiconductor device of claim 2, wherein the gate structure and the first edge fin of the at least two edge fins form a decoupling capacitor.

4. The semiconductor device of claim 2, further comprising a third interconnect structure electrically connecting the first edge fin of the at least two edge fins to the gate structure.

5. The semiconductor device of claim 1, wherein a portion of the gate structure is over the first edge fin of the at least two edge fins, and the portion of the gate structure directly connects conductive elements of the gate structure to the first edge fin of the at least two edge fins.

6. The semiconductor device of claim 1, wherein the at least two edge fins comprise two to four fins.

7. The semiconductor device of claim 1, wherein an effective channel width of each regular fin has a variation of less than about 5%.

8. The semiconductor device of claim 1, further comprising:
   a dummy gate structure between at least two active regions of the plurality of active region, wherein the dummy gate structure is free from being over the fins of the plurality of fins.

9. The semiconductor device of claim 1, wherein in use, the first edge fin of the at least two edge fins are held at a constant voltage by way of the first bus and the first interconnect structure.

10. A fin field-effect transistor (FinFET) based semiconductor device, comprising:
    a digital region and an analog region, said analog region comprising a plurality of active areas, the active areas of the plurality of active areas comprising:
    a plurality of equally-spaced fins, including a plurality of sequential regular fins between at least two edge fins;
    a plurality of gate structures over the plurality of regular fins; and
    a drain region and a source region, the drain region and the source region being electrically connected to the plurality of regular fins and disconnected from the at least two edge fins;
    a first bus configured to be coupled to a voltage potential source;
    a first interconnect structure coupled to a first edge fin of the at least two edge fins and to the first bus;
    a second bus electrically connected to a ground; and
    a second interconnect structure electrically connected to the second bus and to a second edge fin of the at least two edge fins,
    wherein the first edge fin of the at least two edge fins is connected to the voltage potential source by way of the first interconnect structure and the first bus, and the second edge fin of the at least two edge fins is connected to the ground by way of the second interconnect structure and the second bus.

11. The semiconductor device of claim 10, wherein the plurality of gate structures is further disposed over the first edge fin of the at least two edge fins.

12. The semiconductor device of claim 11, wherein the plurality of gate structures and the first edge fin of the at least two edge fins form at least one decoupling capacitor.

13. The semiconductor device of claim 11, further comprising a third interconnect structure electrically connecting the first edge fin of the at least two edge fins to the plurality of gate structures.

14. The semiconductor device of claim 10, wherein a portion of the plurality of gate structures is over the first edge fin of the at least two edge fins, and the portion of the plurality of gate structures directly connects conductive elements of the gate structure to the first edge fin of the at least two edge fins.

15. The semiconductor device of claim 10, wherein an effective channel width of each regular fin has a variation of less than about 3%.

16. A method comprising:
    forming a plurality of fins over a silicon substrate;
    forming an oxide layer between the plurality of fins on the silicon substrate;
    forming a plurality of gate structures across a first portion of the plurality of fins;
    forming a source region across a second portion of the plurality of fins, the second portion of the plurality of fins being a set of sequential fins;
    forming a drain region across the second portion of the plurality of fins;
    forming a plurality of metal lines across the second portion of the plurality of fins;
    forming a first bus configured to be coupled to a voltage potential source;
    forming a first interconnect structure, the first interconnect structure being coupled to a first fin of a third portion of the plurality of fins, and to the first bus, said third portion of the plurality of fins being disconnected from the source region and the drain region;
    connecting the first fin of the third portion of the plurality of fins to the voltage potential source by way of the first interconnect structure and the first bus;
    forming a second bus configured to be coupled to a ground;

forming a second interconnect structure, the second interconnect structure being coupled to a second fin of the third portion of the plurality of fins, and to the second bus; and connecting the second fin of the third portion of the plurality of fins to the ground by way of the second interconnect structure and the second bus, wherein the second portion of the plurality of fins is bounded by at least some of the first portion of the plurality of fins.

17. The method of claim 16, wherein the first fin of the third portion of the plurality of fins and at least one gate structure of the plurality of gate structures together form a decoupling capacitor.

18. The method of claim 16, further comprising forming a third interconnect structure electrically connecting the gate structures of the plurality of gate structures and the third portion of the plurality of fins.

19. The method of claim 16, wherein the third portion of the plurality of fins comprises at least at least the first fin and the second fin, and the first portion of the plurality of fins is between the first fin and the second fin of the third portion of the plurality of fins.

20. The method of claim 16, further comprising:

holding the first fin of the third portion of the plurality of fins at a constant voltage by way of the first bus and the first interconnect structure.

\* \* \* \* \*